US009806250B2

United States Patent
Förg et al.

(10) Patent No.: US 9,806,250 B2
(45) Date of Patent: Oct. 31, 2017

(54) PIEZOELECTRIC ACTUATOR

(71) Applicants: Michael Förg, Freising (DE); Hubert Lachner, Hohenbachern (DE)

(72) Inventors: Michael Förg, Freising (DE); Hubert Lachner, Hohenbachern (DE)

(*) Notice: Subject to any disclaimer, the term of this patent is extended or adjusted under 35 U.S.C. 154(b) by 10 days.

(21) Appl. No.: 14/894,036

(22) PCT Filed: May 7, 2014

(86) PCT No.: PCT/EP2014/059287
§ 371 (c)(1),
(2) Date: Nov. 25, 2015

(87) PCT Pub. No.: WO2014/191172
PCT Pub. Date: Dec. 4, 2014

(65) Prior Publication Data
US 2016/0126444 A1    May 5, 2016

(30) Foreign Application Priority Data

May 29, 2013   (DE) .................. 10 2013 105 557

(51) Int. Cl.
*F16K 31/00* (2006.01)
*H01L 27/20* (2006.01)
(Continued)

(52) U.S. Cl.
CPC .......... *H01L 41/053* (2013.01); *F16K 31/005* (2013.01); *H01L 41/047* (2013.01); *H01L 41/09* (2013.01); *H01L 41/0973* (2013.01)

(58) Field of Classification Search
CPC ... F16K 31/005; F16K 99/0048; H01L 27/20; H01L 41/047; H01L 41/0926; H01L 41/0973
(Continued)

(56) References Cited

U.S. PATENT DOCUMENTS 4,078,160 A * 3/1978 Bost .................. B06B 1/0603
                                                    310/331
4,295,009 A * 10/1981 Weidler .................. H04R 17/00
                                                    310/324
(Continued)

FOREIGN PATENT DOCUMENTS

DE        4410153 C1      2/1995
DE        19961736 A1     6/2001
(Continued)

OTHER PUBLICATIONS

S. Zähringer, N. Schwesinger; What Happens Turning a 250pm Thin Piezo-stack Sideways? An experimental and analytical approach to one-side-actuated piezoelectric micro drives, regarding electrode layouts and directions of deflection, DTIP of MEMS and MOEMS, Rom 2009, pp. 394-397.
(Continued)

*Primary Examiner* — Seth W Mackay-Smith
(74) *Attorney, Agent, or Firm* — Chiesa Shahinian & Giantomasi PC

(57) ABSTRACT

A piezoelectric actuator is provided which acts as a micromechanical actuating element. Thus, the piezoelectric actuator has a piezoelectric element and an electrode structure, wherein said electrode structure is arranged with the electrodes thereof exclusively on one side of the piezoelectric element. Furthermore, the piezoelectric actuator has at least one attachment element, wherein the attachment element is fitted on the piezoelectric element and on the side of the electrode structure of the piezoelectric element, and the attachment element at least partially encompasses the electrode structure of the piezoelectric actuator. The attachment element in the process, by virtue of encompassing the electrode structure, provides a physical limit for the expansion of the piezoelectric element.

11 Claims, 11 Drawing Sheets

(51) Int. Cl.
*H01L 41/047* (2006.01)
*H01L 41/09* (2006.01)
*H01L 41/053* (2006.01)

(58) Field of Classification Search
USPC .................................. 251/129.06; 381/190
See application file for complete search history.

(56) References Cited

U.S. PATENT DOCUMENTS

| | | | | |
|---|---|---|---|---|
| 5,195,142 A | * | 3/1993 | D'Avolio | H04M 1/03 310/324 |
| 5,203,537 A | * | 4/1993 | Jacobs | H01L 41/0973 251/129.06 |
| 5,255,016 A | | 10/1993 | Usui et al. | |
| 5,838,805 A | * | 11/1998 | Warnaka | H04R 17/00 310/322 |
| 5,872,506 A | * | 2/1999 | O'Brien | G10K 9/122 310/322 |
| 6,427,017 B1 | * | 7/2002 | Toki | B06B 1/0688 181/170 |
| 6,614,143 B2 | | 9/2003 | Zhang et al. | |
| 6,741,710 B1 | * | 5/2004 | Takeshima | H04R 1/06 381/190 |
| 7,378,782 B2 | * | 5/2008 | McKinstry | F04B 43/046 310/313 B |
| 7,520,173 B2 | * | 4/2009 | Lee | G01L 9/0022 73/754 |
| 8,193,685 B2 | | 6/2012 | Klee et al. | |
| 9,036,827 B2 | * | 5/2015 | Pompei | G10K 15/02 367/137 |
| 2003/0099371 A1 | * | 5/2003 | Ogura | H04R 7/10 381/426 |
| 2011/0002485 A1 | | 1/2011 | Onishi et al. | |
| 2012/0043485 A1 | * | 2/2012 | Lachner | F16K 99/0001 251/129.01 |
| 2012/0148073 A1 | * | 6/2012 | Kim | H04R 17/005 381/190 |
| 2012/0162664 A1 | * | 6/2012 | Bakke | G02B 26/001 356/519 |
| 2013/0121509 A1 | * | 5/2013 | Hsu | H04R 19/005 381/104 |
| 2013/0207518 A1 | * | 8/2013 | Maki, Jr. | B06B 1/0662 310/334 |
| 2014/0177881 A1 | * | 6/2014 | Fanget | H04R 3/002 381/190 |

FOREIGN PATENT DOCUMENTS

| | | |
|---|---|---|
| DE | 102009002631 A1 | 11/2010 |
| EP | 0404082 A2 | 12/1990 |
| JP | H07213997 A | 8/1995 |
| JP | 2011185399 A | 9/2011 |
| WO | 2011012365 A1 | 2/2011 |

OTHER PUBLICATIONS

International Preliminary Report on Patentability and Written Opinion mailed Dec. 10, 2015 in connection with PCT/EP2014/059287, in English, 17 pages.

* cited by examiner

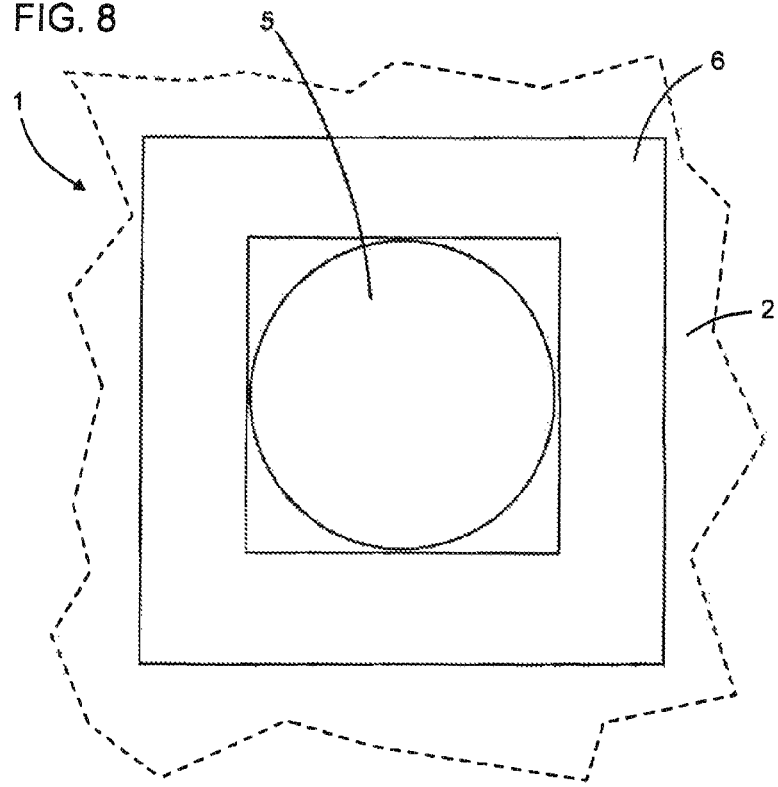
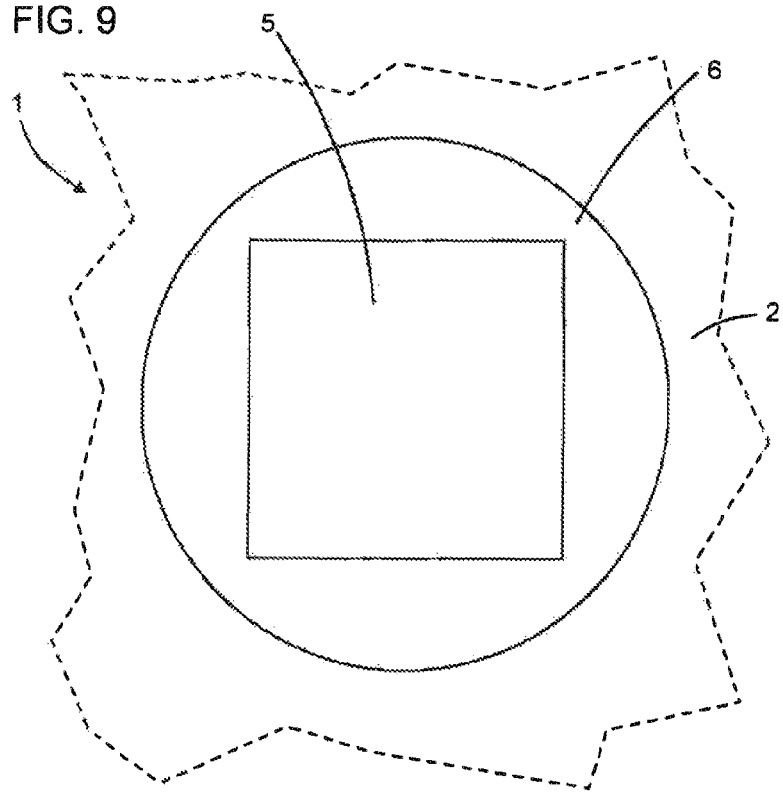

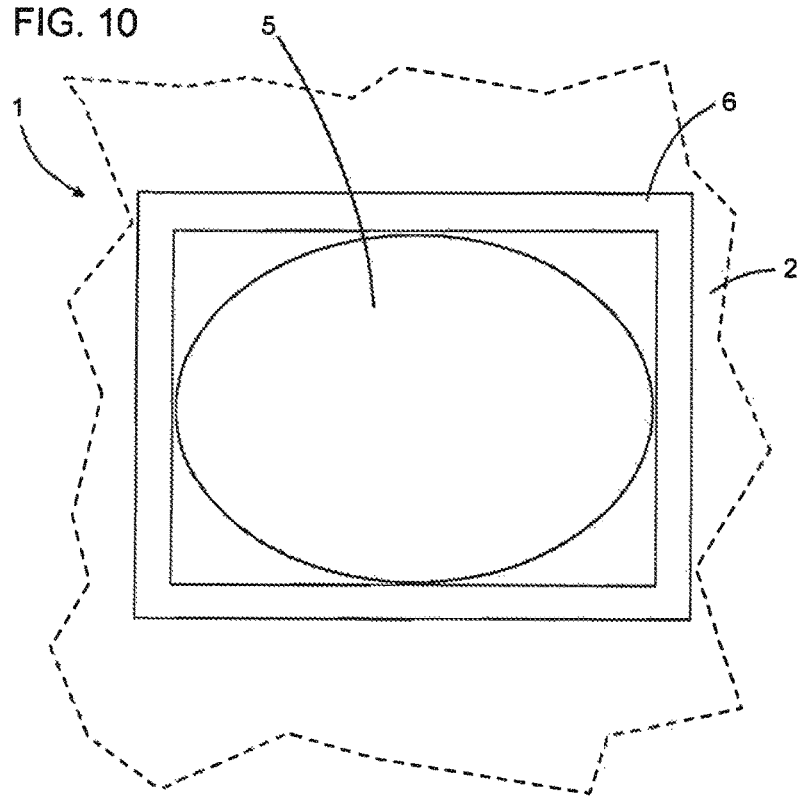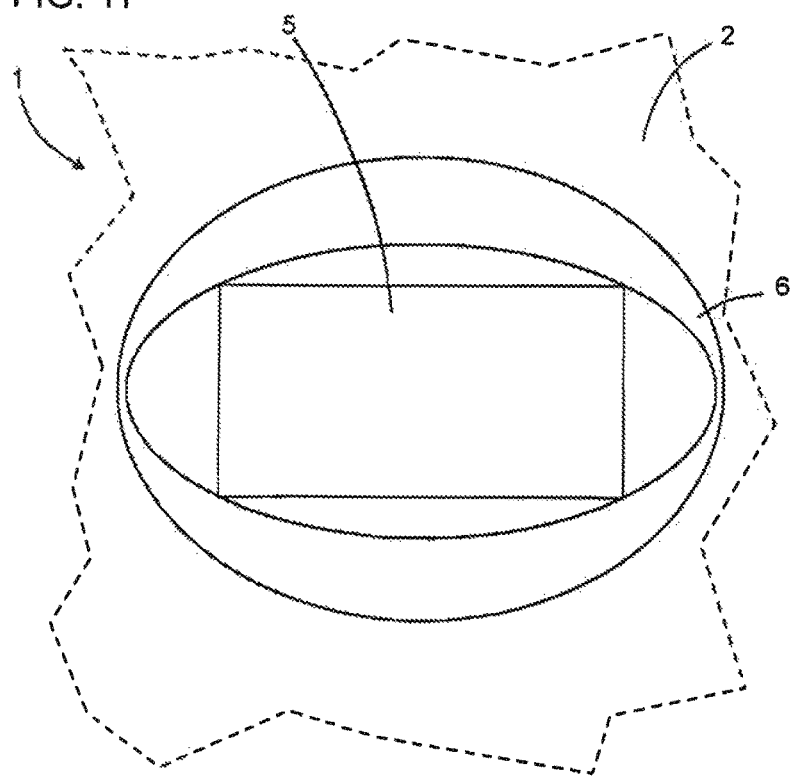

STATE OF THE ART

STATE OF THE ART

STATE OF THE ART

PIEZOELECTRIC ACTUATOR

CROSS-REFERENCE TO RELATED APPLICATIONS

This application is a national stage (under 35 U.S.C. 371) of International Patent Application No. PCT/EP2014/059287, filed May 7, 2014, claiming priority to German Patent Application No. 10 2013 105 557.5, filed May 29, 2013, each of which is herein incorporated by reference in its entirety.

The invention relates to a piezoelectric actuator with electrodes arranged on one side and with at least one attachment element, as well as to the use of this piezoelectric actuator in a microvalve. The piezoelectric actuator of the invention thus acts as a micromechanical actuating element.

Piezoelectric actuators convert electrical energy into mechanical energy and enable extremely small movements with little response time. Standard piezoelectric actuators have the shape of a disc or plate of a specific thickness. The disc or plate is composed of a piezoelectrically advantageous material, such as polycrystalline ferroelectric ceramics (for example, barium titanate or lead zirconate titanate (PZT)). PZT piezoceramic is available in many variants and is a ceramic often used for actuator applications. Also located on each of the two opposite sides of the disc or plate are electrodes which, when excited, produce an electric field that is oriented in the thickness direction of the disc or plate. This electric field in the piezoelectric material leads to a change in length or expansion of the material.

In this process, use is made of the sufficiently known inverse piezoelectric effect, wherein electric fields deform piezoelectric materials. The expansion of the piezoceramic is dependent, among other things, on the electric field strength between the electrodes, the length of the material between the electrodes, and the piezoelectric properties of the material. The actuators often used in actual practice achieve maximum relative deflections of 1/1000 of the thickness of the material. For a larger maximum length change, substantially more material thickness is needed. Moreover, relatively high field strengths in the range of several thousand V/mm are required to achieve the aforementioned ratio of 1/1000. Also, several piezoelectric actuators are often superimposed on one another in order to achieve a greater deflection.

Also known are piezoelectric bending actuators or uni-/bimorph actuators, which are embodied in disc form as so-called disc translators, in which the center of the disc bulges upon excitation. The electrodes are situated on both sides of the piezoelectric material in actuators of this type as well.

Such a construction with electrodes on both sides may not be desirable for some microtechnological applications. This leads to a greater space requirement as well as to high demands in electronic design, for example with regard to flash-over resistance/dielectric strength or the capacity of the electrode actuation. For example, in keeping with these high demands the actuator must be insulated on both sides.

DE 10 2009 002 631 A1 discloses a piezoelectric actuator in which both electrodes are arranged on one side of the piezoelectric material, as well as a microvalve constructed using this actuator. In DE 10 2009 002 631 A1 the inverse piezoelectric effect is used over the entire width of the actuator, and not over the thickness thereof as is the case in standard actuators. FIGS. 16*a* and 16*b* show a cross-section of this piezoelectric actuator. The actuator is in the inactive state In FIG. 16*a*. Said actuator consists of the piezoelectric layer 101 (the piezoelectric element), the membrane 104 or the deformation layer 104 and the electrodes 103, which have an alternating polarity, and said actuator is furthermore fastened, on the sides of the underside of the piezoelectric layer 101, to a membrane support 105. The piezoelectric layer 101 is relatively thin, for example a few hundred microns, and is a few millimeters wide, for example 10 to 50 mm. FIG. 16*b* shows the excited actuator when the electrodes 103 are excited. In succession, electric fields form in the piezoelectric layer 101, and the piezoelectric layer 101 thus expands. The highest field strengths arise in the electrode-side surface of the piezoelectric layer 101, whereas these field strengths diminish toward the inside of the piezoelectric layer 101. Also, the membrane 104 is piezoelectrically neutral, meaning that its length remains largely unaffected by the electric field. Due to the inhomogeneity of the electric field just described, the piezoelectric layer 101 expands to a greater extent on its electrode side than it does in its inside or on its side opposite the electrode side. As a result, the actuator bulges by a certain degree of upward deflection, as shown in FIG. 16*b*.

A detailed explanation of the background of DE 10 2009 002 631 A1 can be found in: S. Zähringer, N. Schwesinger; *What Happens Turning a 250 μm Thin Piezo-stack Sideways? An experimental and analytical approach to one-side-actuated piezoelectric micro drives, regarding electrode layouts and directions of deflection*, DTIP of MEMS and MOEMS, Rome 2009, pages 394-397.

For clarifying the prior art, FIG. 17 shows a view from above of the actuator of DE 10 2009 002 631 with the electrodes 103. The star-shaped electrode structure leads to a radially symmetrical expansion of the piezoelectric layer 101. When the electrodes 103 are excited, this actuator therefore forms a bulge in the shape of a hill or a concavity.

FIGS. 18*a* and *b* as well as 19*a*, *b*, and *c* of the aforementioned publication show a view from above of variants of the electrode structure with a first electrode 103*a* and with a second electrode 103*b*. Different electrode geometries thus lead to different expansion directions of the piezoelectric layer 101 and to different directions and heights of the deflections. In FIGS. 18*a* and 18*b*, the preferential direction of the electric field leads to an expansion of the piezoelectric layer 101, as indicated by the double arrow, whereas in the cases of the electrode structure of FIGS. 19*a* and *c*, the expansion of the piezoelectric layer 101 occurs mainly in the directions indicated by the respective arrow, and in the case of the electrode structure of FIG. 19*b*, the expansion is approximately radially symmetrical. However, slight expansions in other directions also occur due to stray fields and edge effects. For clarification purposes, the respective preferential expansion directions are indicated in the figures by arrows.

What is decisive for the mode of action of the actuator is now the height and reproducibility of the deflection or lift. Hence the piezoelectric actuator of DE 10 2009 002 631 A1 has the disadvantages that, for some applications, its deflection is insufficient or incorrectly oriented or may vary among different actuators of the same construction.

For example, upon excitation, the star-shaped electrode structure shows a deflection that is generally downward, but nevertheless a section in the center of the electrode structure also has an upward deflection.

The deflection of this actuator can furthermore depend on the nature of the piezoelectric layer 101 and on the nature of the electrode structure. Because manufacturing tolerances may arise during the production of the piezoelectric layer 101 and of the electrode structure, the deflections of different actuators of the same construction may also differ from one another. A problem with these actuators thus lies in that the operating characteristics of the latter differ among one another, or a production batch may have actuators with clearly lesser deflections, for example. A standard approach for solving this problem, for instance a position-controlled operation of the actuator using a controller containing a control loop, is associated with high costs.

Furthermore, the shape of the piezoelectric layer 101 also influences the deflection. A square actuator, for example, exhibits a different deflection than a round actuator, even when the other basic conditions (actuation voltage, electrode structure, etc.) and the maximum dimensions are the same. For certain applications, however, the deflection of different actuators must be nearly identical, regardless of their shape.

In view of the problem explained above, the object of the invention is to propose a piezoelectric actuator with an optimized deflection. Another object of the present invention consists in proposing a piezoelectric actuator that has better reproducibility of this deflection. In addition, a partial object of the invention is to propose a piezoelectric actuator that has greater independence from the shape of the actuator.

The object addressed by the invention is solved by a piezoelectric actuator according to claim 1. Advantageous developments and embodiments are the subject of the other subordinate and dependent claims.

In particular, an attachment element is fitted on the piezoelectric element. By encompassing the electrode structure, the attachment element provides a physical limit for the expansion of the piezoelectric element. For this purpose the attachment element has an inner cavity or recess which defines an encompassed zone. Due to the fact that the expansion of the piezoelectric element is limited to the encompassed area, the deflection of the actuator or the efficiency of the actuator increases. The expansion is thus concentrated on the encompassed zone. Furthermore, a piezoelectric element with a star-shaped electrode structure with the attachment element of the invention henceforth has a deflection exclusively towards the side of the electrode structure. The deflection also becomes to a very large extent independent of the actual outer shape of the piezoelectric element and the manufacturing tolerances, which could negatively influence the distribution of forces in the piezoelectric element.

The attachment element is furthermore positioned on the surface of the piezoelectric element on the same side as the electrode structure, as this is the place of strongest deformation and precisely where the attachment element can receive the forces directly.

According to one development of the invention, the at least partially encompassed area of the piezoelectric element is completely or nearly completely covered by the electrode structure. The larger the area of the electrode structure, the greater the volume of the piezoelectric element that is used for the inverse piezoelectric effect, and the greater the achievable expansion of the piezoelectric element is as well. This feature thus optimizes the area utilization of the piezoelectric element as well as the deflection of the piezoelectric element.

According to one development of the invention, the attachment element is exclusively in contact with the piezoelectric element.

According to one development of the invention, the attachment element is adapted to the electrode structure fitted on one side of the piezoelectric actuator in such a way that said attachment element largely limits an expansion in the plane of the piezoelectric element in the directions in which the piezoelectric element, due to the configuration of the electrode structure, mainly expands. Different configurations of the electrode structure result in different preferential directions of the expansion of the actuator. Hence it is not necessary to design the attachment element such that the latter limits the expansion of the piezoelectric element in all directions equally, i.e., the attachment element can also be embodied as only partially encompassing or partially reinforced. The attachment element can thus be designed in a more expedient and/or more target-oriented manner.

According to one development of the invention, the electrode structure can be partially situated under the attachment element.

According to one development of the invention, there can be an area-wise under- or overlapping of the area of the electrode structure with the area encompassed by the attachment element.

According to one development of the invention, the attachment element can have recesses or gaps. The latter can be provided, say, for contacts of the electrode structure at points that are not critical to the function or rigidity of the attachment element.

According to one development of the invention, the material of the piezoelectric element can be a lead zirconate titanate (PZT) ceramic. PZT piezoceramic is available in many different forms and is the most often used ceramic for piezoelectric actuator applications. PZT possesses a sufficient rigidity for this purpose, even when the electrode is not excited.

According to one development of the invention, the attachment element can be made of a material with a high elastic modulus. The more resistance the attachment element exerts against its deformation (i.e., the higher its elastic modulus is), the better it fulfills its previously described function. An elastic modulus of ca. 1 kN/mm$^2$ or more is sufficiently high for the application. This requirement is fulfilled by certain kinds of plastics and metals.

According to one development of the invention, the attachment element can be made of a material with a high conductivity and can be grounded. In this case, however, the attachment element may not be or come into in contact with the electrodes. There are relatively high voltages on the electrodes of the electrode structure. Since the electrode structure is at least partially encompassed by the attachment element, a conductive attachment element (one made of metal, for example) that is grounded can provide protective grounding or serve as a neutral pole of the electrodes.

According to another aspect of the invention, according to claim 11, a microvalve is proposed which has the actuator as in one of claims 1 through 10, with at least one inlet channel and at least one outlet channel. Thus provision can be made of a microvalve that is closed in the non-excited state because the piezoelectric element is rigid and remains flat in that state and is open in the excited state.

The features and functions of the present invention described above as well as additional aspects and features will be further described in the following, with the aid of a detailed description of preferred embodiments and with reference to the appended figures.

BRIEF DESCRIPTION OF THE DRAWINGS

Herein:

FIG. 8 shows a view from above of a piezoelectric actuator of a seventh embodiment of the present invention;

FIG. 9 shows a view from above of a piezoelectric actuator of an eighth embodiment of the present invention;

FIG. 10 shows a view from above of a piezoelectric actuator of a ninth embodiment of the present invention;

FIG. 11 shows a view from above of a piezoelectric actuator of a tenth embodiment of the present invention;

FIG. 1 shows a cross-section, and FIG. 2 shows a view from above, of a first embodiment of the piezoelectric actuator 1 of the invention.

Figure 1:
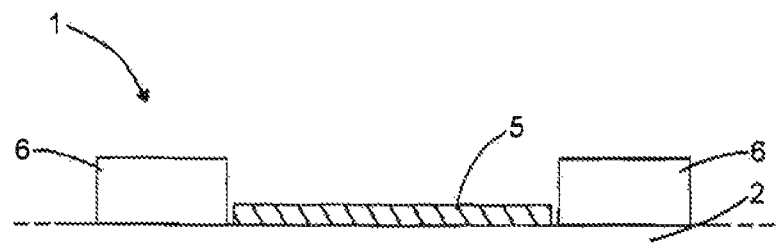
FIG. 1 shows a cross-section of a piezoelectric actuator of a first embodiment of the present invention.
Figure 2:
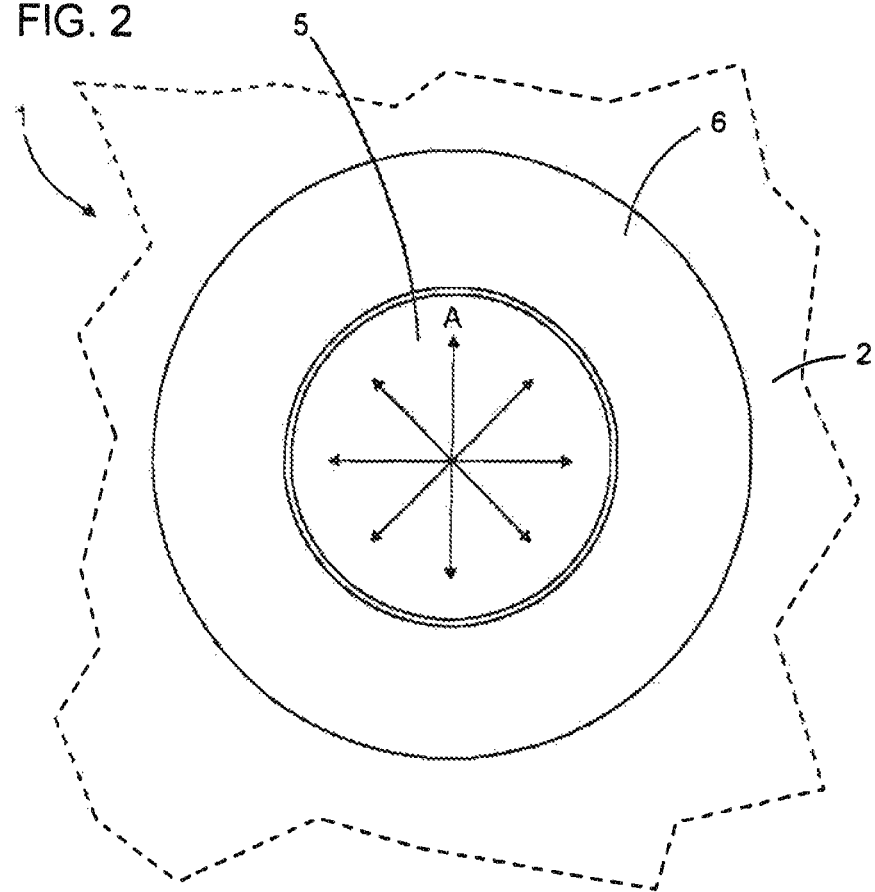
FIG. 2 shows a view from above of the piezoelectric actuator of the first embodiment of the present invention.

The piezoelectric element 2 of the piezoelectric actuator 1 is designed in the shape of a flat disc or plate. The material of the piezoelectric element is a material with high piezoelectric coefficients, preferably lead zirconate titanate (PZT) in the form of a ceramic. As an alternative, use can be made of other ferroelectric materials such as barium titanate, for example. In addition, the use of materials such as quartz or lead magnesium niobate is also conceivable. Furthermore, the outer shape of the piezoelectric element 2 can be freely adapted to the application, for example to the available support area. For example, this shape can thus be round, rectangular, square, oval, or even a polygon with any number of edges. This arbitrary shape is indicated in FIG. 2 by the dashed outline.

Figure 18A:
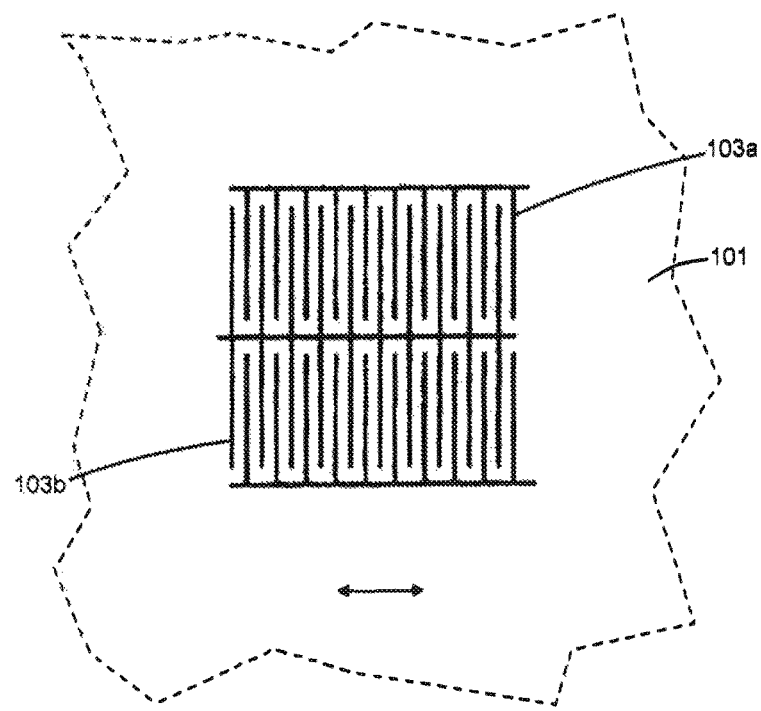
FIGS. 18a, b show a view from above of a prior art piezoelectric actuator with variants of an electrode structure with a first electrode and a second electrode.
Figure 18B:
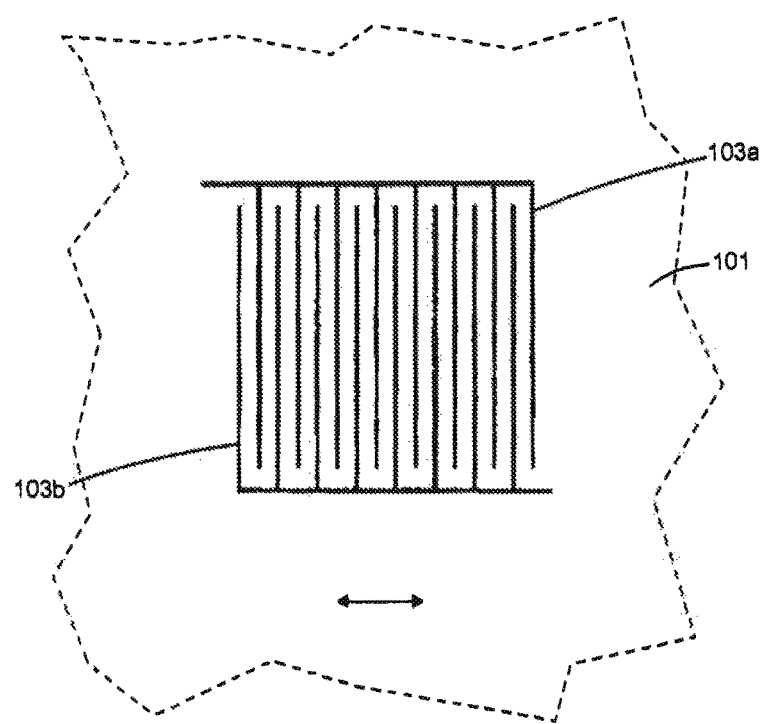

On one side, or rather on one of the flat surfaces of the piezoelectric element 2, is situated an electrode structure 5 with typically two electrodes. In the following, this side will also be designated as the top side. The side facing away from the top side will hereinafter be designated as the underside. Furthermore, a configuration with three or more electrodes is also conceivable, wherein each of these electrodes can then be excited separately, for example. The electrodes are configured as surface electrodes which are applied to the piezoelectric element by means of, for example, sputtering or a vapor plating technique. Examples of such electrode structures are found in FIGS. 18a, b and 19a, b, c. Furthermore, preference is given to a star-shaped configuration of the electrode structure 5. The electrode structure 5 is thus situated on only one side of the piezoelectric element and occupies a defined area thereon. This area of the electrode structure 5 is the surface acted on by the electrodes of the electrode structure 5 and the interspaces between the electrodes. In other words the (whole) area of the electrode structure 5 is defined by the outer contour thereof (cf. outline in FIG. 2). The piezoelectric actuator 1 can be fixed, for example on its underside.

If a voltage is now applied to the electrode structure 5, an inhomogeneous electric field arises between the individual electrodes. The electric field strengths in the vicinity of the electrodes and in the surface of the piezoelectric element 2 are the strongest, whereas the field strengths diminish from the surface of the piezoelectric element 2 toward the inside of the piezoelectric element 2. As a result, the piezoelectric element 2 expands, in an area-wise manner, more on the side of the electrode structure 5 than on its underside, which leads to a bending of the piezoelectric element 2.

Furthermore, an attachment element 6 is fitted on the piezoelectric element 2, said attachment element encompassing the electrode structure 5. The attachment element 6 thus provides a physical limit for the outward expansion of the piezoelectric element 2 (cf. arrows A in FIG. 2), whereby the expansion of the piezoelectric element 2 cannot continue propagating in the radial directions (in the plane) of the piezoelectric element 2 beyond the limit, but rather is essentially only able to continue propagating perpendicularly to the plane of the piezoelectric element 2.

In addition, the attachment element 6 is positioned on the same side as the electrode structure 5 on the surface of the piezoelectric element 2, as this is the place of strongest deformation. The attachment element 6 can thus receive the forces resulting from the deformation of the piezoelectric element 2 directly and immediately.

The attachment element 6, which is composed of, for example, a plastic or metal with a high elastic modulus, is relatively easily produced with a high degree of size accuracy, whereas a precision processing of the relatively thin and brittle piezoelectric element 2 of the actuator 1 is a complex and cost-intensive process. The attachment element 6 thus simplifies the production of the actuator 1.

The attachment element 6 should now have the highest possible resistance to elastic deformation caused by impinging forces. The cross-sectional area and the shape of the cross-section play a substantial role in determining the shape of the attachment element 6.

Ideally, the inner contour of the attachment element 6, which defines the encompassed area of the attachment element 6, coincides with the area of the electrode structure 5. This means that the optimum deflection of the actuator 1 is reached in the case in which the encompassed area of the attachment element 6 coincides with the area of the electrode structure 5.

As an alternative, there can be an area-wise under- or overlap of the electrode structure 5 with the encompassed area of the attachment element 6. It has been experimentally determined that a suitable deflection is still achieved with an under- or overlap of up to 30%.

Figure 3:
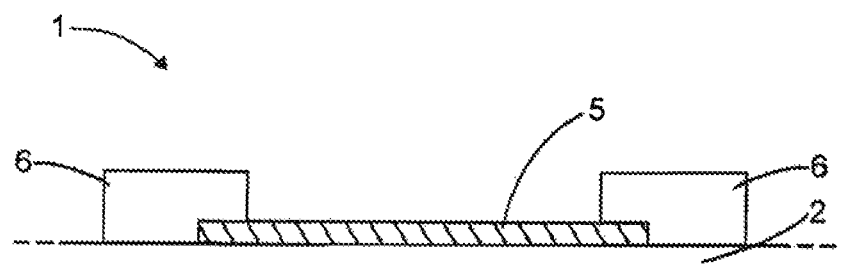
FIG. 3 shows a cross-section of a piezoelectric actuator of a second embodiment of the present invention.

FIG. 3 shows a piezoelectric actuator 1 of a second embodiment of the present invention. In this embodiment, the electrode is at least partially overlapped by the attachment element 6. The area of the electrode structure 5 can thus be enlarged without excessively reducing the rigidity of the attachment element 6.

Figure 4:
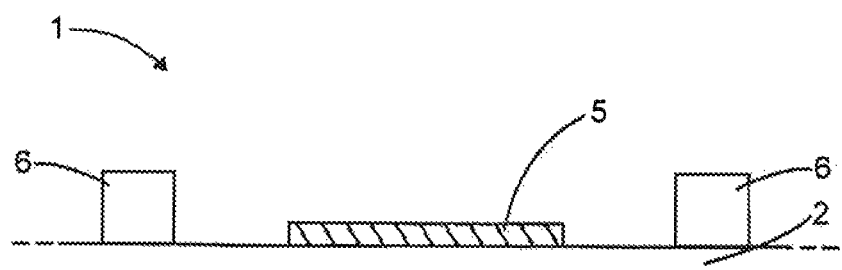
FIG. 4 shows a cross-section of a piezoelectric actuator of a third embodiment of the present invention.

FIG. 4 shows a piezoelectric actuator 1 of a third embodiment of the present invention. In principle, the outer contour of the electrode structure 5 does not have to be in direct abutment with the inner contour of the attachment element 6. The deflection of the piezoelectric element 2 is limited by the maximum strength or brittleness of the material used for the piezoelectric element 2.

Figure 5:
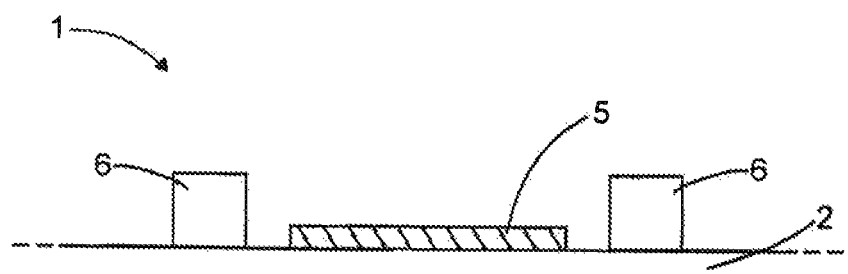
FIG. 5 shows a cross-section of a piezoelectric actuator of a fourth embodiment of the present invention.

FIG. 5 shows a piezoelectric actuator 1 of a fourth embodiment of the present invention. In contrast to embodiments one through three, in this embodiment the attachment element 6 is not fastened on the edge of the piezoelectric element 2, but further towards the middle. This is useful if, for example, the dimensions of the piezoelectric element 2 are very large. As an alternative, the electrode structure 5 in this embodiment can extend directly to the attachment element 6.

Figure 6:
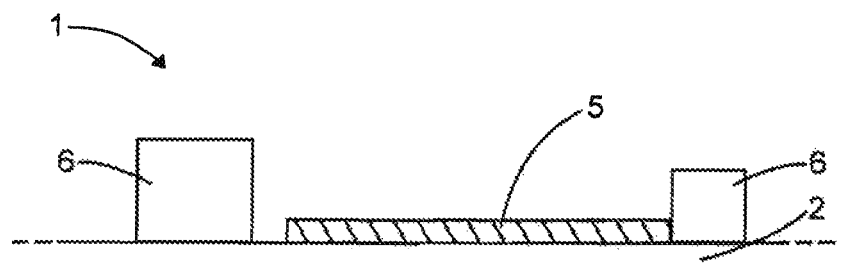
FIG. 6 shows a cross-section of a piezoelectric actuator of a fifth embodiment of the present invention.
Figure 7:
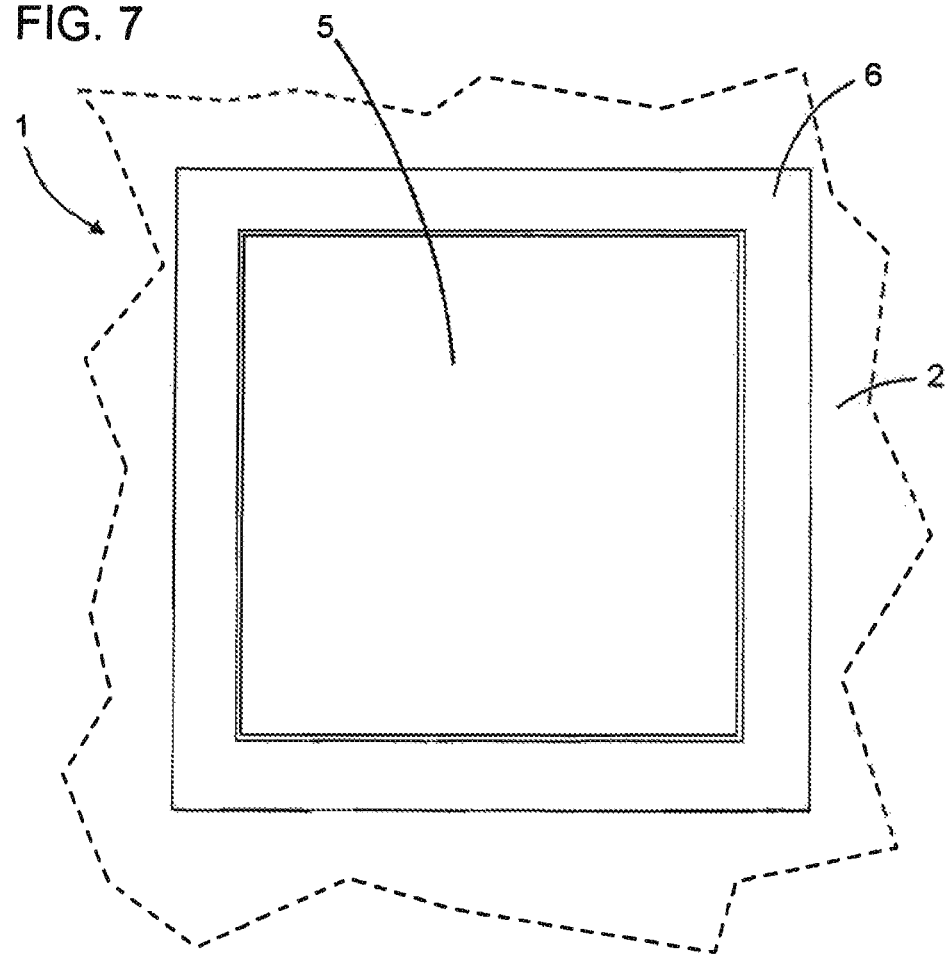
FIG. 7 shows a view from above of a piezoelectric actuator of a sixth embodiment of the present invention.

FIG. 6 shows a piezoelectric actuator 1 of a fifth embodiment of the present invention. Here the attachment element 6 is asymmetrically configured. The electrode structure 5 is likewise not configured centrically, but rather as laterally shifted. An asymmetric deflection of the piezoelectric element is achievable by virtue of these two factors. Hence the maximum of the deflection will no longer lie in the middle of the piezoelectric element 2 and the shape of the bulge will likewise be asymmetric. This can be useful if, for example, optic systems such as reflectors, for example, are actuated by the actuator 1 of the present invention.

Figure 12:
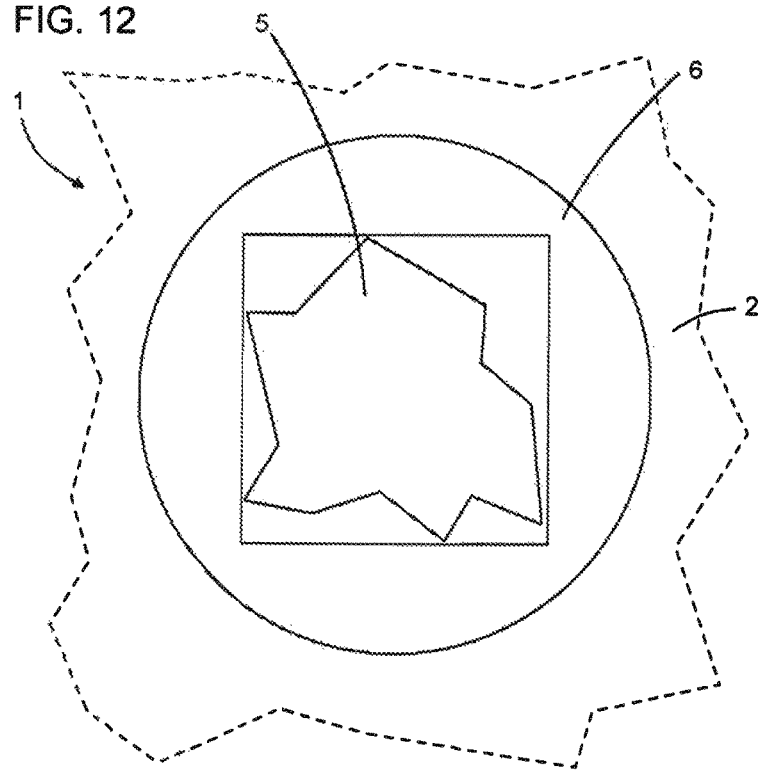
FIG. 12 shows a view from above of a piezoelectric actuator of an eleventh embodiment of the present invention.
Figure 19A:
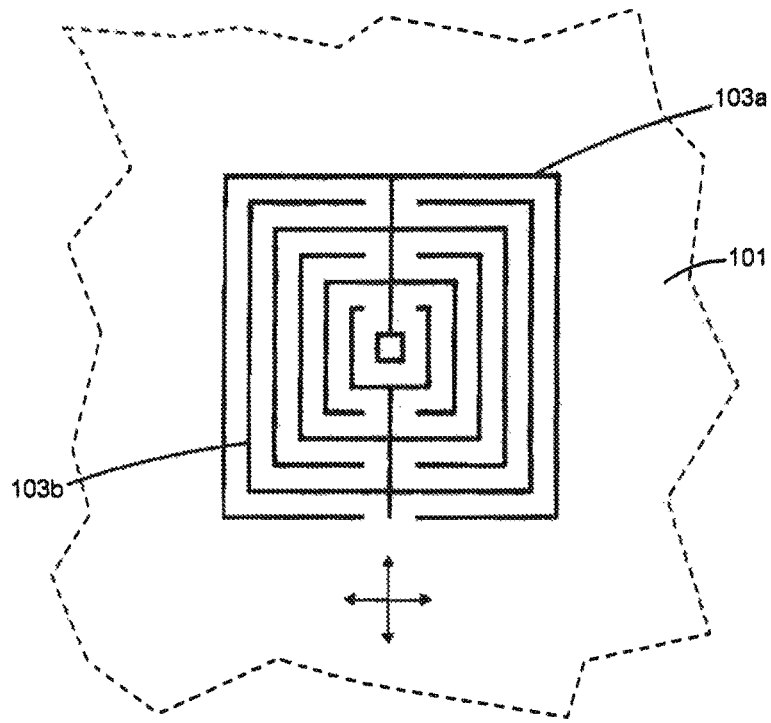
FIGS. 19a, b, c show a view from above of a prior art piezoelectric actuator with variants of an electrode structure with a first electrode and a second electrode.
Figure 19B:
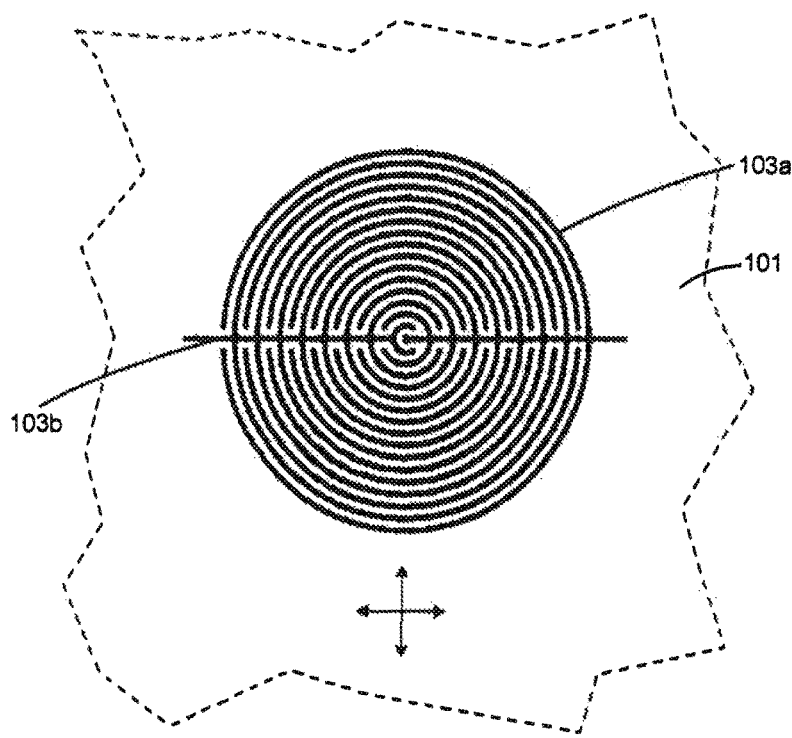
Figure 19C:
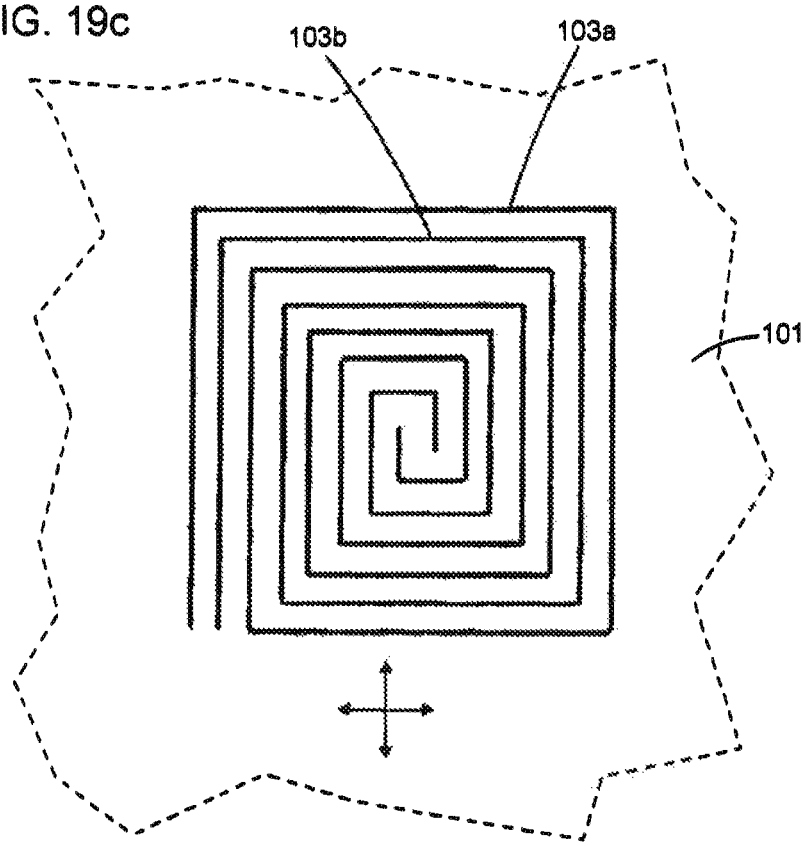

FIGS. 7 through 12 show views from above of various geometries of the electrode structure 5 and of the attachment element 6 according to a sixth through an eleventh embodiment, respectively. Accordingly, the outer contour of the electrode structure 5 can coincide with the inner contour of the attachment element 6, although this is not absolutely necessary. For instance, for manufacturing technology reasons it may be easier to use a square attachment structure 6 to encompass a circular electrode structure 5. The shapes of the electrode structure 5 and of the attachment element 6 can thus differ from one another as long as they fulfill their purpose. A portion of the area of the piezoelectric element 2 can also remain unused, as explained in connection with the fourth embodiment. In addition, the electrode structure 5 can have an irregular outer contour, as shown in FIG. 12. The shape and configuration of the electrode structure 5, jointly with the attachment element, determine the shape of the bulge of the piezoelectric element 2. For instance, the electrode structure 5 of FIG. 19b, jointly with the attachment element 6 of FIG. 8, gives rise to a symmetric, hill-shaped bulge. These geometries can thus be varied to a large extent without deviating from the solution principle of the invention.

Figure 13:
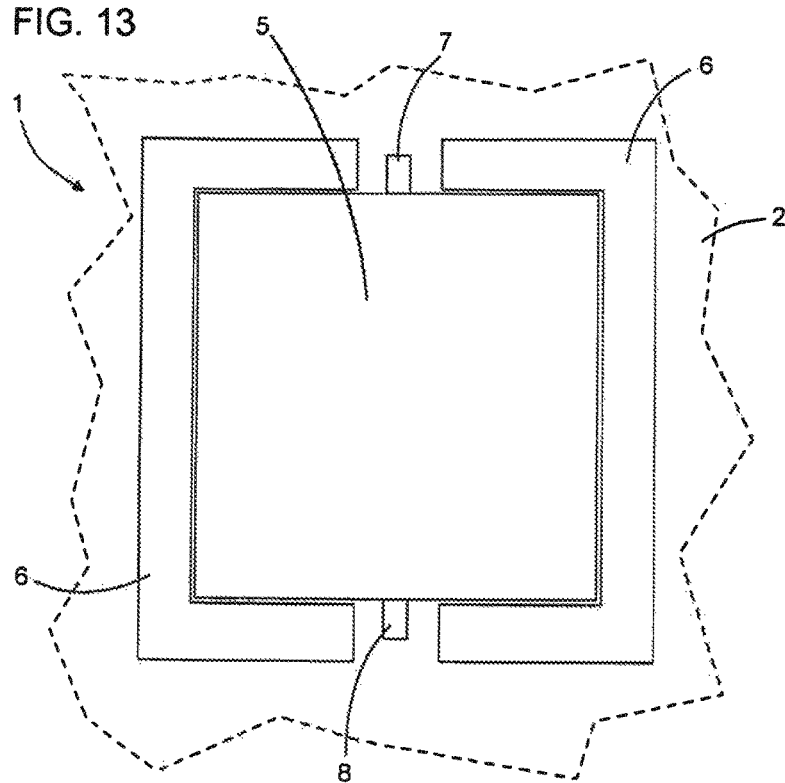
FIG. 13 shows a view from above of a piezoelectric actuator of a twelfth embodiment of the present invention.

FIG. 13 shows an actuator 1 according to a twelfth embodiment, with two attachment elements 6 which jointly encompass partially, preferably nearly completely, an electrode structure 5. Thus it is not necessary to use just one attachment element 6. Several attachment elements 6, for example two or three, can also form a common enclosure. As an alternative, an attachment element 6 can be segmented. The resulting gaps can be used, for example, for a first contact point 7 and a second contact point 8 for connecting to the electrodes of the electrode structure 5.

Figure 14:
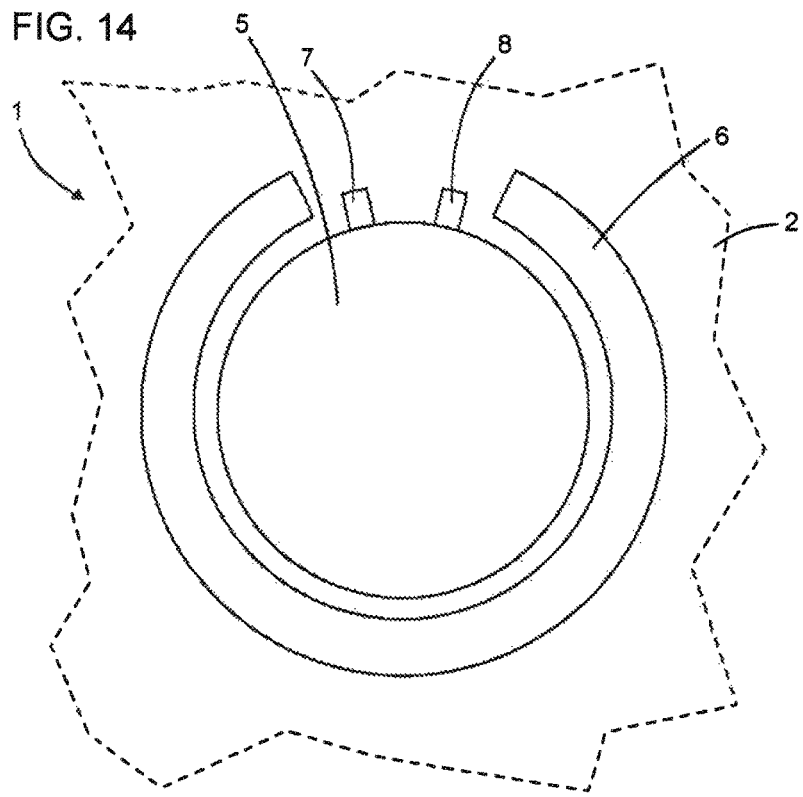
FIG. 14 shows a view from above of a piezoelectric actuator of a thirteenth embodiment of the present invention.

FIG. 14 shows an actuator 1 according to a thirteenth embodiment, with an attachment element 6 which only partially encompasses an electrode structure 5. In certain circumstances it is possible to ignore the structural weakening due to a gap in the attachment element 6 for, say, a first contact point 7 and a second contact point 8 for connecting to the electrodes of the electrode structure 5. The prerequisite for this is, for example, a high rigidity of the material used for the attachment element 6 and/or a sufficiently small gap.

Figure 15A:
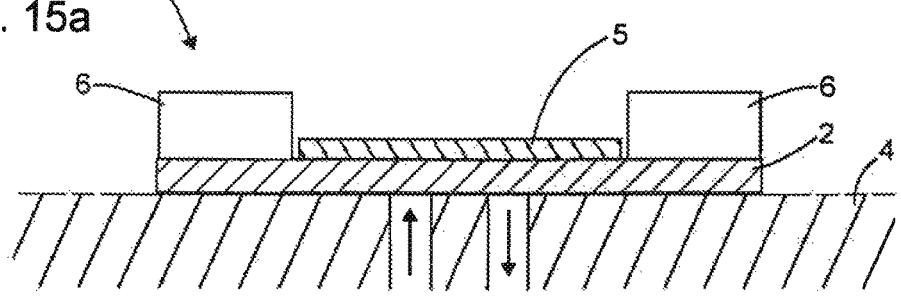
FIG. 15a shows a vertical cross-section of a microvalve, which is constructed with a piezoelectric actuator of any embodiment of the present invention and which is closed.
Figure 15B:
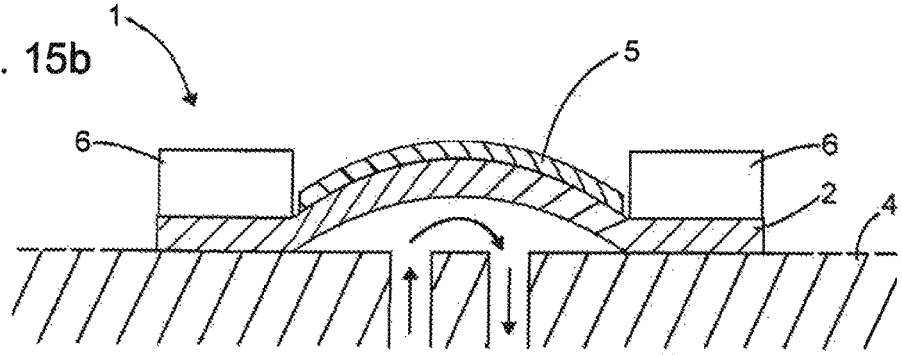
FIG. 15b shows a cross-section of a microvalve, which is constructed with a piezoelectric actuator of any embodiment of the present invention and which is open.
Figure 16A:
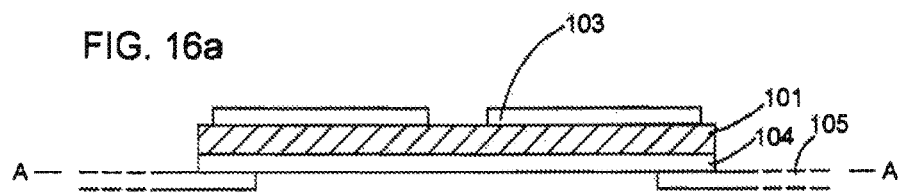
FIG. 16a shows a cross-section of a prior art actuator whose electrodes are not excited.
Figure 16B:
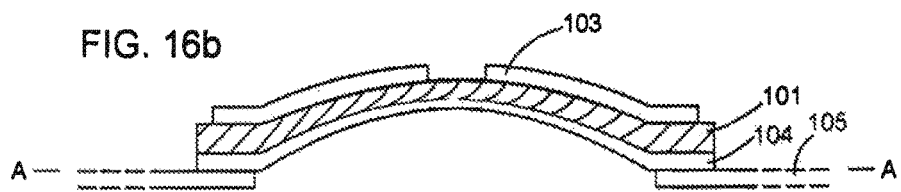
FIG. 16b shows a cross-section of a prior art actuator whose electrodes are excited.
Figure 17:
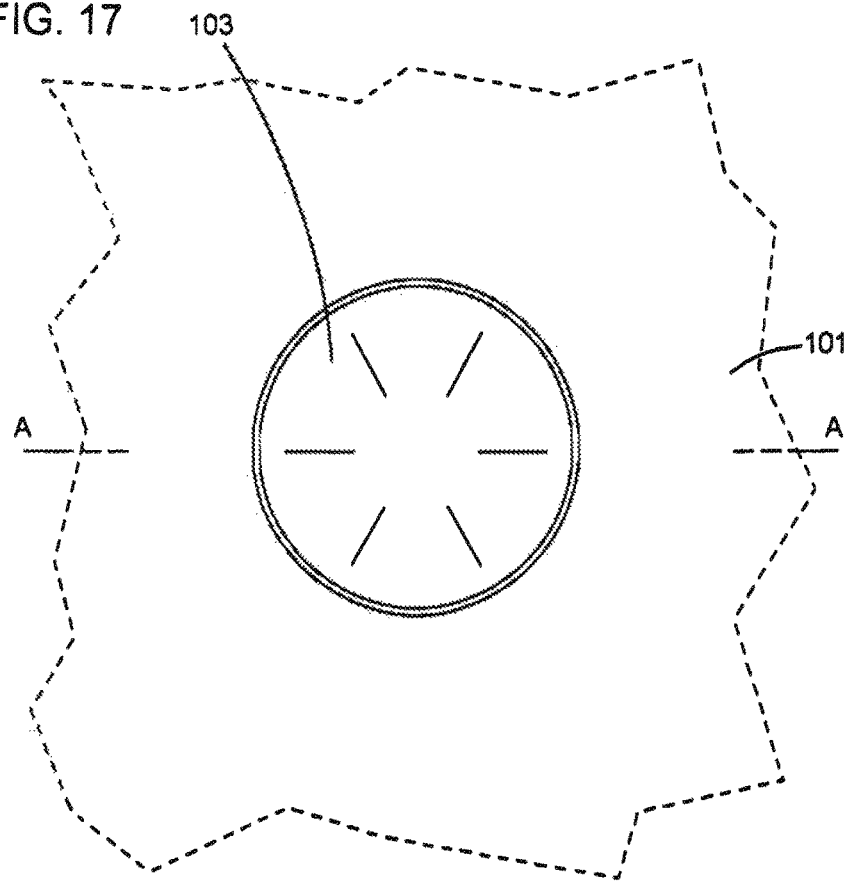
FIG. 17 shows a view from above of a prior art piezoelectric actuator.

FIGS. 15a and 15b show the exemplary use of the piezoelectric actuator of the present invention as a microvalve. For this purpose, a support 4 or rather a valve seat 4 of the actuator 1 has two through-holes, which form at least one inlet channel and at least one outlet channel for a liquid or a gas. FIG. 15a illustrates the state in which the microvalve is closed. The electrode structure 5 is not excited, i.e., the piezoelectric element 2 is inactive. The high inherent rigidity of the piezoelectric element results in the valve remaining closed, even in the event of counter-pressure in the inlet channel. FIG. 15b illustrates the state in which the microvalve is open. In this state, the electrode structure 5 is excited. In order to keep the pressure loss of the valve at a low level, it is important that the deflection of the piezoelectric element 2 be large. This deflection is improved by the attachment element 6, as explained in the preceding. An advantage of this application is, among other things, that the liquid or the gas does not contact the electrodes and that with a simple construction of the microvalve, the deflection thereof is sufficient to keep the pressure loss small.

In addition to the embodiments explained herein, the invention permits other design principles. For instance, the geometries of the different embodiments can also be freely combined with one another. For example, an electrode structure with an irregular outer contour can also be combined with an incomplete enclosure.

Even though provision is made of one electrode structure 5 for one piezoelectric element 2 in all embodiments, the piezoelectric element 2 can also have several electrodes structures 5 with associated attachment elements 6 in each case. For example, a single large-area piezoelectric element 2 can have a plurality of, e.g., four or twelve, electrode structures 5, wherein each electrode structure 5 is then surrounded by at least one attachment element 6. Thus, several actuators 1 can be produced from a single piezoelectric element 2, the attachment element 6 ensuring a physical separation of these actuators even though the latter share a common piezoelectric element 2.

LIST OF REFERENCE NUMERALS 1 piezoelectric actuator
2 piezoelectric element
4 support or valve seat
5 electrode structure
6 attachment element
7 first contact point
8 second contact point

The invention claimed is:
1. A piezoelectric actuator, comprising:
a piezoelectric element;
an electrode structure having electrodes and arranged exclusively on a side of the piezoelectric element; and
at least one attachment element attached to the piezoelectric element on a same side as the side on which the electrode structure is arranged, wherein the at least one attachment element at least partially encompasses the electrode structure of the piezoelectric actuator, and wherein the at least one attachment element is exclusively in contact with the piezoelectric element.

2. The piezoelectric actuator according to claim 1, wherein an area of the piezoelectric element at least partially encompassed by the at least one attachment element is completely or nearly completely covered by the electrode structure.

3. The piezoelectric actuator according to claim 1, wherein the at least one attachment element is adapted to the electrode structure fitted on one side of the piezoelectric actuator in such a way that the at least one attachment element limits an expansion in a plane of the piezoelectric element in directions in which said piezoelectric element expands due to a configuration of the electrode structure.

4. The piezoelectric actuator according to claim 1, wherein the electrode structure is partially situated under the at least one attachment element.

5. The piezoelectric actuator according to claim 1, wherein an area of the electrode structure is up to 30% smaller or larger than an area encompassed by the at least one attachment element.

6. The piezoelectric actuator according to claim 1, wherein the at least one attachment element has at least one recess or gap.

7. The piezoelectric actuator according to claim 1, wherein the material of the piezoelectric element is lead zirconate titanate (PZT).

8. The piezoelectric actuator according to claim 1, wherein the at least one attachment element is formed of a material with a high elastic modulus.

9. A microvalve with a piezoelectric actuator according to claim 1, and
    with at least one inlet channel in a support of the piezoelectric actuator, and
    with at least one outlet channel in the support, wherein said microvalve is configured such that it is closed in a non-energized state and open in an energized state.

10. The piezoelectric actuator according to claim 1, wherein the at least one attachment element is formed of a material with high conductivity and is grounded.

11. A piezoelectric actuator, comprising:
    a piezoelectric element;
    an electrode structure having electrodes and arranged exclusively on a side of the piezoelectric element; and
    at least one attachment element attached to the piezoelectric element on a same side as the side on which the electrode structure is arranged, wherein the at least one attachment element at least partially encompasses the electrode structure of the piezoelectric actuator, wherein an area of the piezoelectric element at least partially encompassed by the at least one attachment element is completely or nearly completely covered by the electrode structure, and wherein the attachment element is formed of a material with high conductivity and is grounded.

* * * * *